(12) United States Patent
Balan et al.

(10) Patent No.: US 11,121,019 B2
(45) Date of Patent: Sep. 14, 2021

(54) SLOTTED ELECTROSTATIC CHUCK

(71) Applicant: KLA-Tencor Corporation, Milpitas, CA (US)

(72) Inventors: Aviv Balan, Mountain View, CA (US); Haoran Jiang, San Jose, CA (US)

(73) Assignee: KLA Corporation, Milpitas, CA (US)

( * ) Notice: Subject to any disclaimer, the term of this patent is extended or adjusted under 35 U.S.C. 154(b) by 284 days.

(21) Appl. No.: 16/152,731

(22) Filed: Oct. 5, 2018

(65) Prior Publication Data

US 2019/0385882 A1   Dec. 19, 2019

Related U.S. Application Data

(60) Provisional application No. 62/687,017, filed on Jun. 19, 2018.

(51) Int. Cl.
*H01L 21/68*    (2006.01)
*H01L 21/683*   (2006.01)

(52) U.S. Cl.
CPC ........ *H01L 21/6833* (2013.01); *H01L 21/681* (2013.01)

(58) Field of Classification Search
None
See application file for complete search history.

(56) References Cited

U.S. PATENT DOCUMENTS

| | | | |
|---|---|---|---|
| 5,692,873 A | 12/1997 | Weeks et al. | |
| 5,697,751 A | 12/1997 | Takahashi | |
| 5,777,838 A * | 7/1998 | Tamagawa | H01L 21/6831 279/128 |
| 6,056,825 A | 5/2000 | Sumnitsch | |
| 6,828,772 B1 | 12/2004 | Hofer et al. | |
| 7,292,427 B1 | 11/2007 | Murdoch et al. | |
| 8,919,563 B2 | 12/2014 | Gregerson et al. | |
| 8,980,001 B2 | 3/2015 | Sakurai et al. | |
| 2003/0178576 A1* | 9/2003 | Pan | H01J 37/20 250/442.11 |
| 2004/0025322 A1 | 2/2004 | Binnard | |
| 2004/0070914 A1 | 4/2004 | Ferreres | |
| 2009/0002913 A1* | 1/2009 | Naim | H01L 21/67109 361/234 |
| 2009/0092470 A1* | 4/2009 | Bonora | H01L 21/68707 414/226.01 |

(Continued)

FOREIGN PATENT DOCUMENTS

| | | | | |
|---|---|---|---|---|
| JP | 2001118914 A * | 4/2001 | | H01L 21/6831 |
| WO | 2000078654 A9 | 6/2001 | | |

OTHER PUBLICATIONS

PCT/US2019/036439, International Search Report, dated Sep. 30, 2019.

(Continued)

*Primary Examiner* — Jeffrey A Gblende
(74) *Attorney, Agent, or Firm* — Huse IP Law; Charles C. Huse

(57) ABSTRACT

An assembly for clamping semiconductor wafers includes a plate and an electrostatic chuck mounted on the plate. A plurality of slots extends between respective portions of the electrostatic chuck to receive arms of an end-effector of a wafer-handler. The arms of the end-effector support semiconductor wafers being placed onto and removed from the electrostatic chuck.

22 Claims, 6 Drawing Sheets

(56) References Cited

U.S. PATENT DOCUMENTS

2011/0297321 A1* 12/2011 Matsuda .......... H01L 21/67069
  156/345.51
2012/0100464 A1  4/2012 Kageyama
2015/0086316 A1  3/2015 Greenberg et al.

OTHER PUBLICATIONS

PCT/US2019/036439, Written Opinion of the International Searching Authority, dated Sep. 30, 2019.

* cited by examiner

SLOTTED ELECTROSTATIC CHUCK

RELATED APPLICATION

This application claims priority to U.S. Provisional Patent Application No. 62/687,017, filed Jun. 19, 2018, titled "Slotted Monolithic Mirror Plate with Electrostatic Chuck," which is hereby incorporated by reference in its entirety for all purposes.

TECHNICAL FIELD

This disclosure relates to semiconductor wafer handling, and more specifically to an electrostatic wafer chuck with slots used for wafer handling.

BACKGROUND

Electrostatic wafer chucks, or electrostatic chucks for short, are used in semiconductor manufacturing equipment to hold wafers. An electrostatic chuck uses high voltage to create an electrostatic force that clamps a semiconductor wafer to the chuck. Traditionally, electrostatic chucks use lift pins for loading and unloading wafers. When loading a wafer, the lift pins rise up from the electrostatic chuck, receive the wafer from an end-effector of a wafer handler, and then lower back down until the wafer rests on the surface of the chuck. When unloading a wafer, the lift pins rise up to raise the wafer above the surface of the chuck, so that the end-effector of the wafer handler can slide between the wafer and the surface of the chuck to pick up the wafer. The use of lift pins, however, creates several problems. Lift pins require travel space above the wafer and require a z-stage or other travel mechanism for lifting the pins, which adds weight and complexity to the system. Also, the travel time of the lift pins reduces throughput.

SUMMARY

Accordingly, there is a need for more efficient methods and systems for loading and unloading semiconductor wafers from an electrostatic chuck. Such methods and systems may be achieved by slotting the electrostatic chuck.

In some embodiments, an assembly for clamping semiconductor wafers includes a plate and an electrostatic chuck mounted on the plate. A plurality of slots extends between respective portions of the electrostatic chuck to receive arms of an end-effector of a wafer-handler. The arms of the end-effector support semiconductor wafers being placed onto and removed from the electrostatic chuck.

In some embodiments, a method of handling semiconductor wafers includes supporting a semiconductor wafer on arms of an end-effector of a wafer handler. With the semiconductor wafer supported on the arms of the end-effector, the semiconductor wafer is placed onto an electrostatic chuck, by positioning the arms of the end-effector in respective slots that extend between portions of the electrostatic chuck. With the semiconductor wafer on the electrostatic chuck, the arms of the end-effector are withdrawn from the respective slots. The semiconductor wafer is clamped to the electrostatic chuck. Clamping the semiconductor wafer to the electrostatic chuck includes biasing the electrostatic chuck.

BRIEF DESCRIPTION OF THE DRAWINGS

For a better understanding of the various described embodiments, reference should be made to the Detailed Description below, in conjunction with the following drawings.

Like reference numerals refer to corresponding parts throughout the drawings and specification.

DETAILED DESCRIPTION

Reference will now be made in detail to various embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Figure 1:
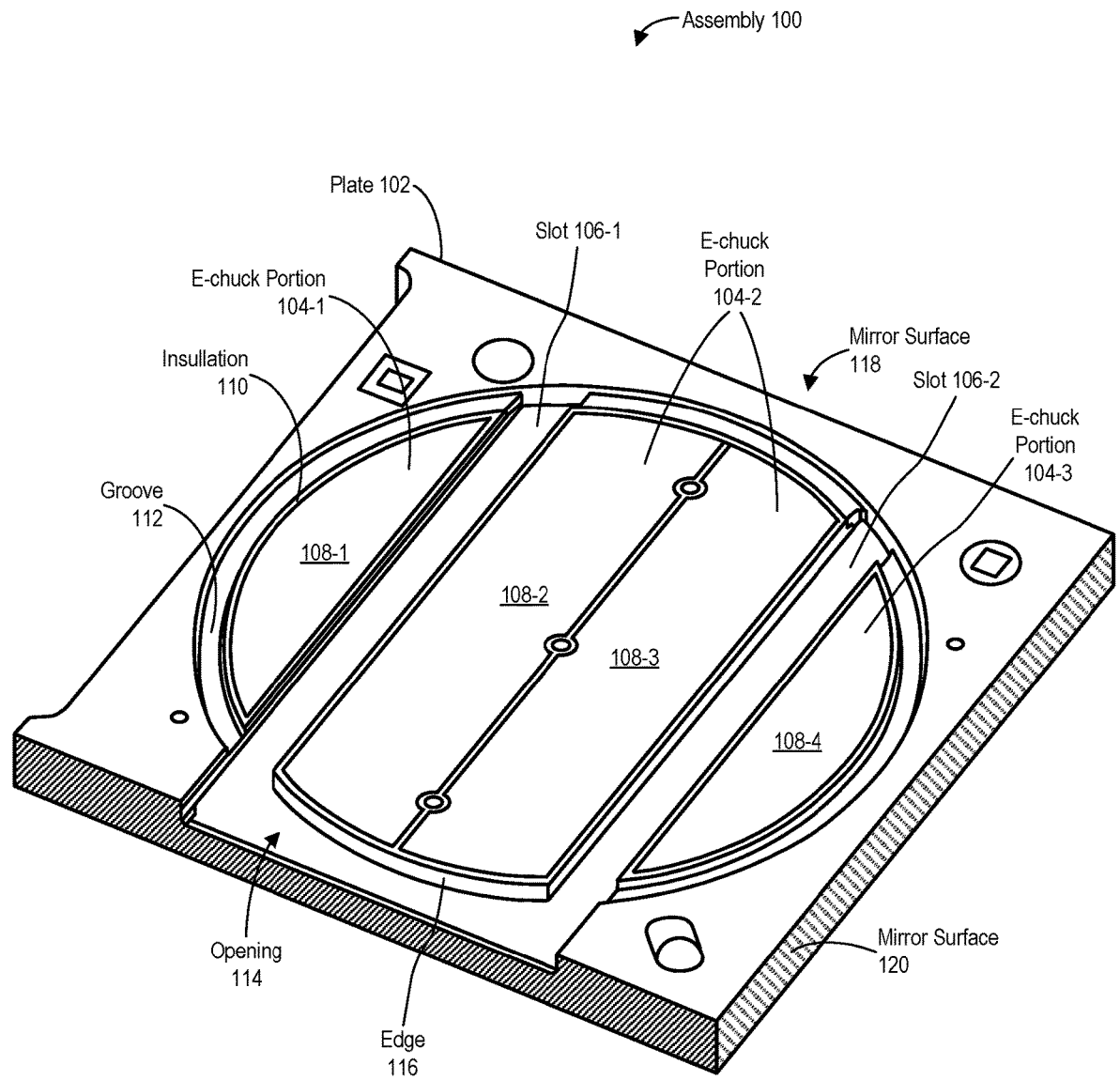
FIGS. 1 and 2 are perspective views of assemblies for clamping semiconductor wafers in accordance with some embodiments.

FIG. 1 is a perspective view of an assembly 100 for clamping semiconductor wafers in accordance with some embodiments. The assembly 100, which is used in semiconductor-manufacturing equipment, includes a slotted electrostatic chuck mounted on a plate 102. The slotted electrostatic chuck includes three electrostatic-chuck ("e-chuck") portions 104-1, 104-2, and 104-3 that are mounted on the plate 102 and are separated by slots 106-1 and 106-2. The slots 106-1 and 106-2 are sized to receive arms of an end-effector of a wafer handler (e.g., arms 502 and 504 of an end-effector 500, FIG. 5). The end-effector arms are used to place semiconductor wafers onto and remove semiconductor wafers from the slotted electrostatic chuck: the arms support a wafer while the wafer is being loaded or removed. In some embodiments, the portions 104-1, 104-2, and 104-3 are distinct chuck surfaces; the slots 106-1 and 106-2 extend completely across the electrostatic chuck and thus divide the electrostatic chuck into distinct portions with distinct surfaces. In the example of FIG. 1, the slot 106-1 is situated between the portions 104-1 and 104-2, and the slot 106-2 is situated between the portions 104-2 and 104-3. Alternatively, one or both of the slots may extend only partway across the electrostatic chuck, such that some or all of the portions are connected. Regardless, the assembly 100 is a monolithic assembly, because the portions 104-1, 104-2, and 104-3 are mounted on the plate 102. The portions 104-1, 104-2, and 104-3 are coplanar (e.g., mesas 404, FIG. 4, on the portions 104 are coplanar) to within a specified degree (e.g., to within 10 um), to ensure that wafers can rest evenly on the electrostatic chuck. The portions 104-1, 104-2, and 104-3 and slots 106-1 and 106-2 are collectively sized to receive and support semiconductor wafers of a specified diameter (e.g., 300 mm). While FIG. 1 illustrates an electrostatic chuck with two slots 106 and three portions 104, the number of slots and corresponding portions may vary.

Each of the portions 104, and thus each distinct surface of the electrostatic chuck, may be divided into one or more electrode areas 108 and insulation 110. The insulation 110 surrounds each of the electrode areas 108. In the example of FIG. 1, the portion 104-1 includes a single electrode area 108-1 surrounded by insulation 110, the portion 104-2 includes two electrode areas 108-2 and 108-3 surrounded by insulation 110, and the portion 104-3 includes a single electrode area 108-4 surrounded by insulation 110. The electrode areas 108 may be divided into groups of one or more (e.g., two) electrode areas, each group of which may be independently biased to clamp a semiconductor wafer.

In some embodiments, the plate 102 is a mirror plate, such that one or more of its sides are mirrors (e.g., laser-interferometer mirrors used for positioning the plate within a piece of semiconductor-manufacturing equipment). For example, the plate 102 includes a mirror surface 118 for positioning the plate 102 in a first direction (e.g., the x-direction, or alternatively the y-direction) and/or a mirror surface 120 for positioning the plate 102 in a second direction (e.g., the y-direction, or alternatively the x-direction).

In some embodiments, an opening 114 is located on one side of the plate 102 (e.g., in the mirror surface 118, which is notched to create the opening) and is sized, along with the slots 106-1 and 106-2, to accommodate the end-effector. The opening 114 extends from the side of the plate to the slots 106-1 and 106-2 and also to an edge 116 of the portion 104-2 that extends between the slots 106-1 and 106-2. (Equivalently, the slots 106-1 and 106-2 may be considered to extend to the side of the plate 102 and to be joined by the opening 114). The slots 106-1 and 106-2 and the opening 114 effectively compose a substantially U-shaped slot to receive the arms of the end-effector. (The U-shaped slot is not precisely U-shaped because, for example, the side of the plate is straight and the corners where the edge 116 meets the slots 106-1 and 106-2 may be sharp, but is still recognizable as a U.) The opening 114 may have a depth, as measured from the top of the side of the plate 102 (e.g., the top of the mirror surface 118), equal to the depth of the slots 106-1 and 106-2.

In some embodiments, a groove 112 surrounds the electrostatic chuck (e.g., the portions 104-1, 104-2, and 104-3). The groove 112 may intersect the opening 114, each end (or alternatively, a single end) of the slot 106-1, and each end (or alternatively, a single end) of the slot 106-2. In the example of FIG. 1, the groove 112 (i.e., the portions of the groove 112 distinct from the opening 114 and slots 106-1 and 106-2) has a depth that is less than the depth of the opening 114 and the slots 106-1 and 106-2. The groove 112 may be used to identify the location of the electrostatic chuck and thus to ensure that semiconductor wafers are properly placed onto the electrostatic chuck.

Dimensions of various elements of the assembly 100 may vary for different embodiments. In some embodiments, the depth of the slots 106-1 and 106-2 and opening 114 is 10 mm, the width of the slots 106-1 and 106-2 is 23 mm, the depth and/or width of the groove 112 is 4 mm, and/or the groove 112 is sized to surround a 300 mm wafer.

Figure 2:
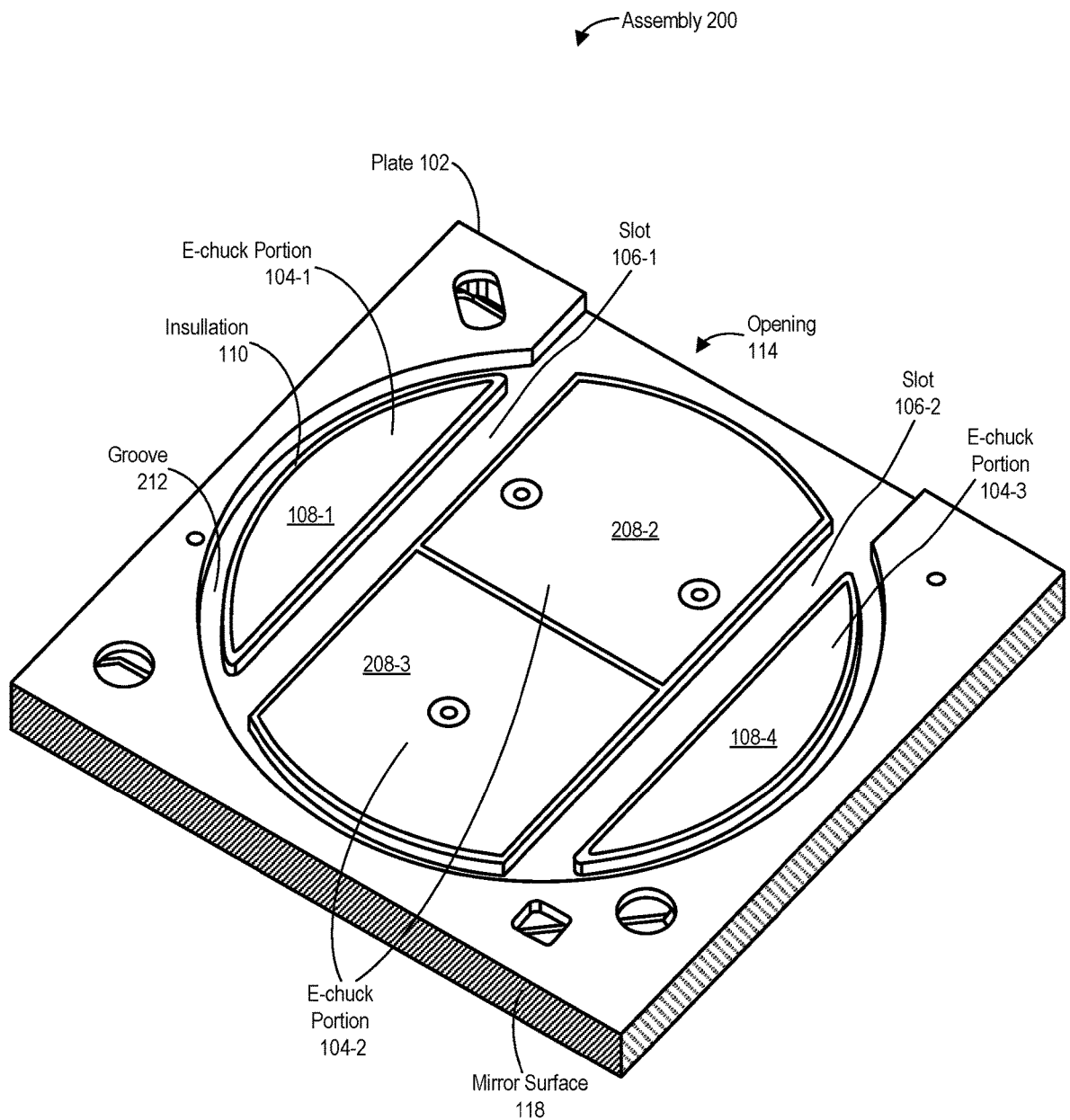

The arrangement of electrode areas in a respective portion of the electrostatic chuck may also vary for different embodiments. FIG. 2 is a perspective view of the top of an assembly 200 for clamping semiconductor wafers in which the electrode areas 108-2 and 108-3 of the portion 104-2 are replaced with electrode areas 208-2 and 208-3, in accordance with some embodiments. The electrode areas 208-2 and 208-3 are electrically isolated from each other and from the electrode areas 108-1 and 108-4, and may be biased independently of each other. Each of the electrode areas 208-2 and 208-3, like the electrode areas 108, may be surrounded by insulation 110. For example, the electrode areas 108-1 and 208-2 (or 108-1 and 208-3) may be electrically connected such that they can be biased to a first bias voltage, while the electrode areas 208-3 and 108-4 (or 208-2 and 108-4) may be electrically connected such that they can be biased to a second bias voltage.

In the assembly 200, the groove 112 is replaced by a groove 212 that has a depth equal to the depths of the slots 106-1 and 106-2 and the opening 114, in accordance with some embodiments. Using the same depth (e.g., 10 mm) for the groove 212, slots 106-1 and 106-2, and opening 114 avoids sharp corners where the groove 212 intersects the slots 106-1 and 106-2, which is desirable in the high-voltage environment of an electrostatic chuck.

Figure 3:
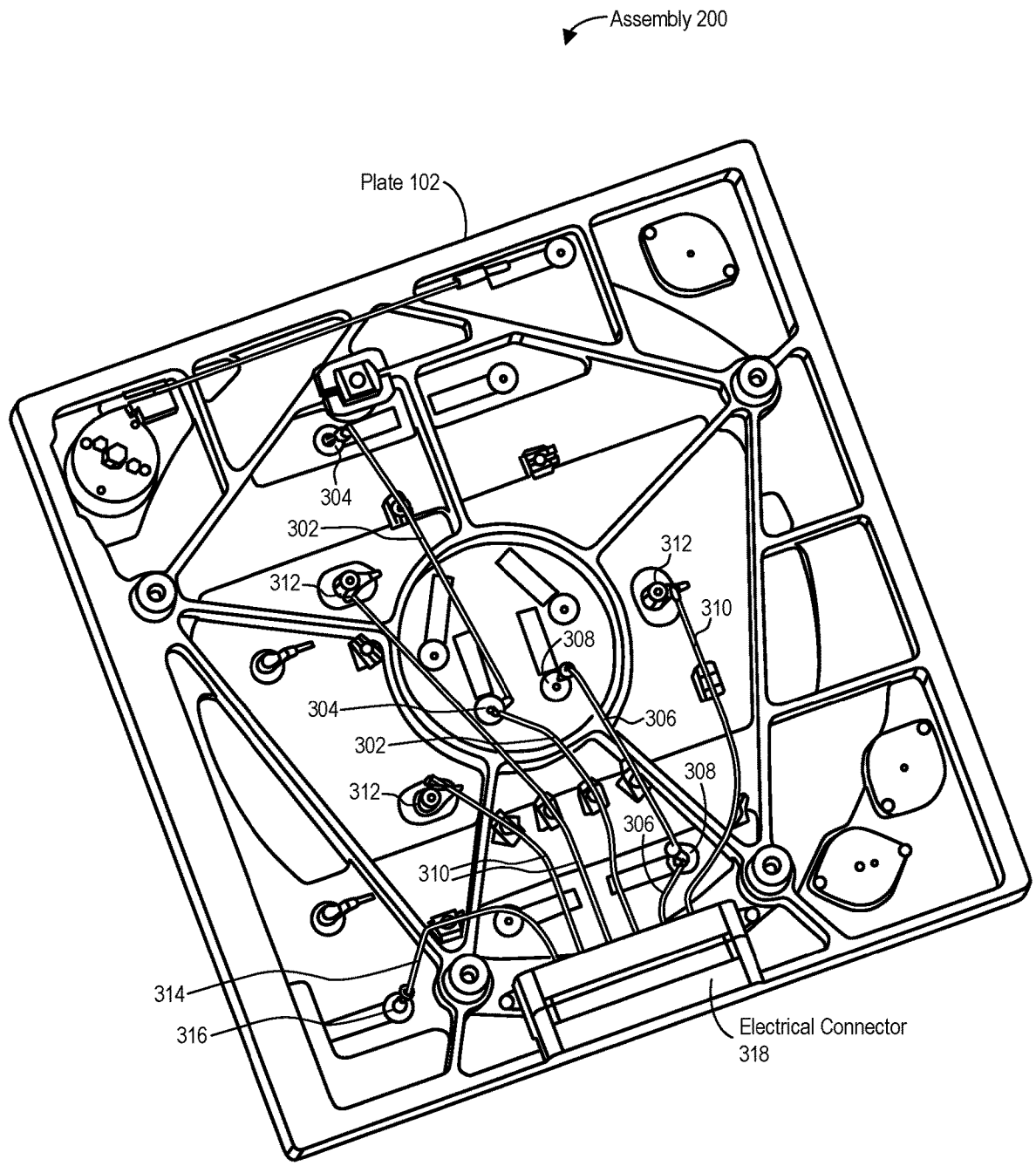
FIG. 3 is a perspective view of the bottom of the assembly of FIG. 2 in accordance with some embodiments.

FIG. 3 is a perspective view of the bottom of the assembly 200 in accordance with some embodiments. An electrical connector 318 is attached to the bottom of the plate 102. Wiring 302 runs from the electrical connector 318 to electrical contacts 304 that connect to the electrode areas 108-1 and 208-2 (FIG. 2). Wiring 306 runs from the electrical connector 318 to electrical contacts 308 that connect to the electrode areas 108-4 and 208-3 (FIG. 2). The wiring 302 is used to apply a first bias voltage to the electrode areas 108-1 and 208-2, while the wiring 306 is used to apply a second bias voltage to the electrode areas 108-4 and 208-3. The first and second bias voltages are separate, independent bias voltages. Other wiring 310 and 314 runs from the electrical connector 318 to respective electrical contacts 312 and 316 that connect to the plate 102 and are used to bias features of the plate 102. For example, the wiring 314 and contact 316 are used to apply a third bias to the surface of the plate 102 (e.g., including the opening 114, slots 106, and groove 112/212, FIGS. 1-2). The third bias voltage is separate from and independent of the first and second bias voltages.

Figure 4:
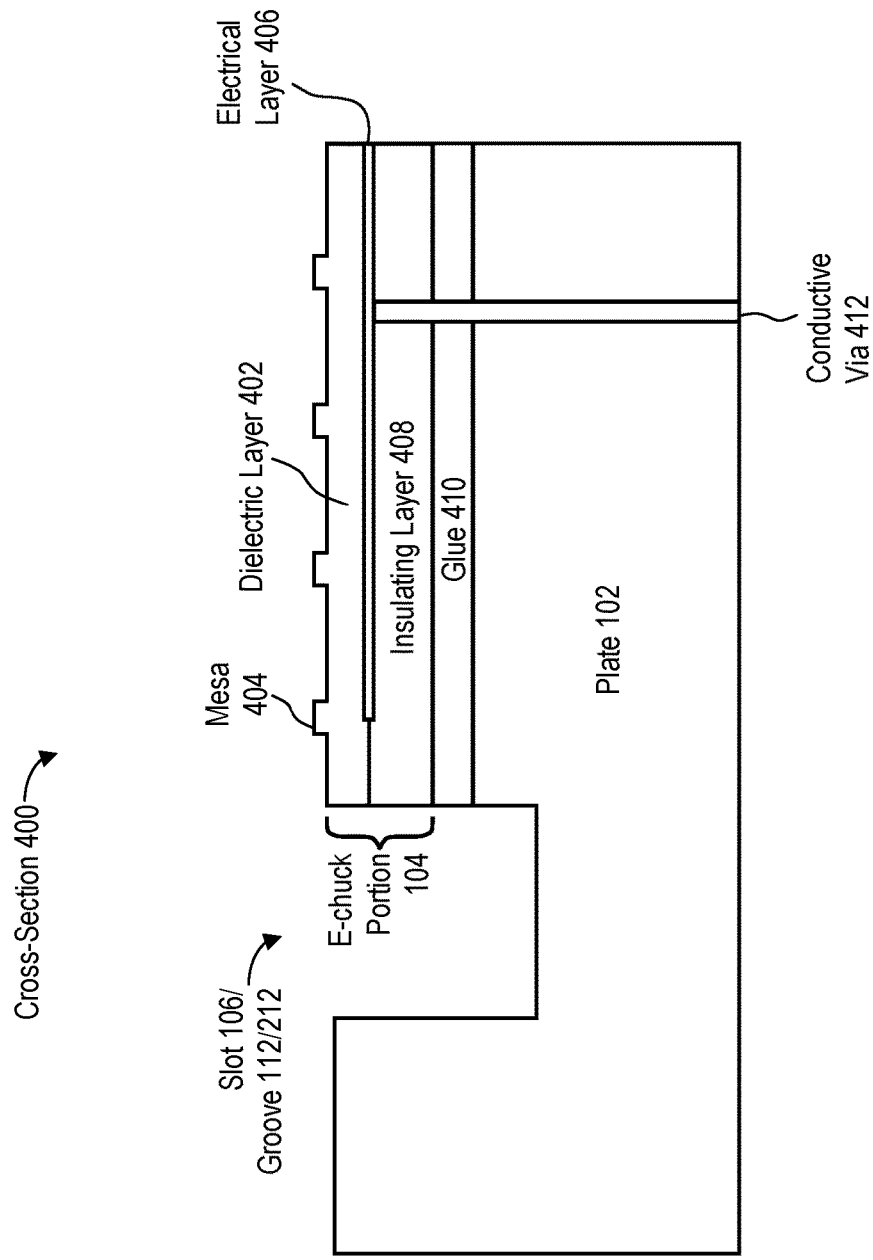
FIG. 4 shows a cross-section of an assembly such as the assembly of FIG. 1 or 2 in accordance with some embodiments.

FIG. 4 shows a cross-section 400 of an assembly (e.g., the assembly 100 or 200, FIGS. 1-3) in accordance with some embodiments. An electrostatic chuck portion 104 is next to a slot 106 or a groove 112/212. The portion 104 includes a top dielectric layer 402 (e.g., a first layer of glass), a conductive electrical layer 406 beneath the dielectric layer 402, and an insulating layer 408 (e.g., a second layer of glass) beneath the electrical layer 406. In some embodiments, the dielectric layer 402 includes mesas 404 on its surface, which support a semiconductor wafer positioned on the electrostatic chuck. In some embodiments, the electrical layer 406 does not extend to the edge of the portion 104. Instead, the electrical layer 406 terminates before the edge (i.e., before the interface between the portion 104 and the slot 106 or groove 112/212). The edge-region of the portion 104, in which the electrical layer 406 is absent and the dielectric layer 402 contacts the insulating portion 408, corresponds to the insulation 110 (FIGS. 1-2). The extent of the electrical layer 406 defines an electrode area 108/208 in the portion 104. Each electrode area 108/208 thus includes a respective electrical layer 406 situated beneath a dielectric layer 402, in accordance with some embodiments.

The portion 104 is mounted on the plate 102 (e.g., a mirror plate) using a layer of glue 410. For example, each of the portions 104-1, 104-2, and 104-3 (FIGS. 1-2), and thus each distinct chuck surface, is separately glued to the plate 102 using a respective layer of glue 410. A conductive via 412 (e.g., a via filled with conductive glue) extends through the plate 102, layer of glue 410, and insulating layer 408 to electrically connect the electrical layer 406 to a contact 304 or 308 (FIG. 3). The electrical layer 406 is thus electrically connected to the electrical connector 318 through the conductive via 412, one or more contacts 304 or 308, and wiring 302 or 306.

Figure 5:
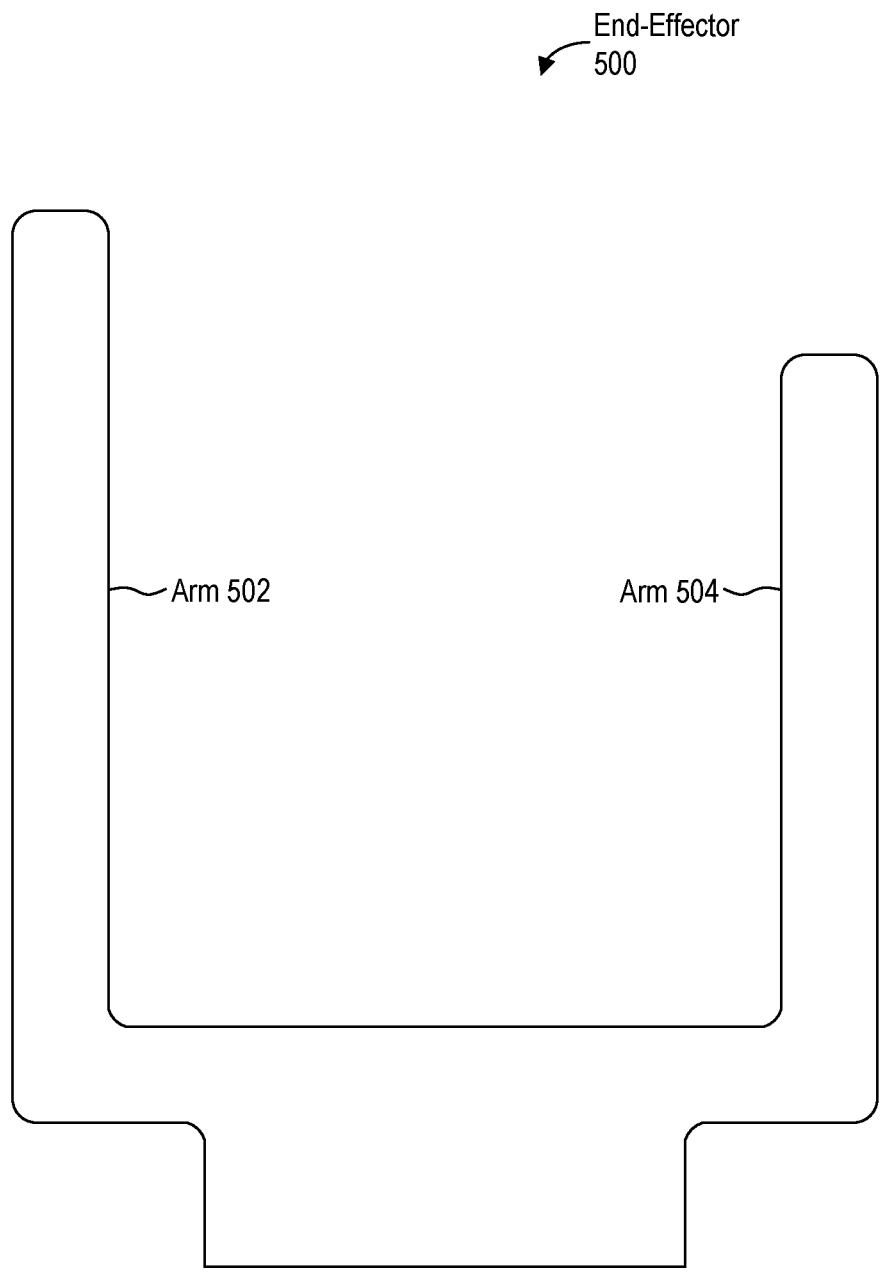
FIG. 5 is a plan view of an end-effector of a wafer handler in accordance with some embodiments.

FIG. 5 is a plan view of an end-effector 500 of a wafer handler in accordance with some embodiments. The end effector includes a first arm 502 and a second arm 504, which together may support a semiconductor wafer. The slots 106-1 and 106-2 are sized to receive the arms 502 and 504.

Figure 6:
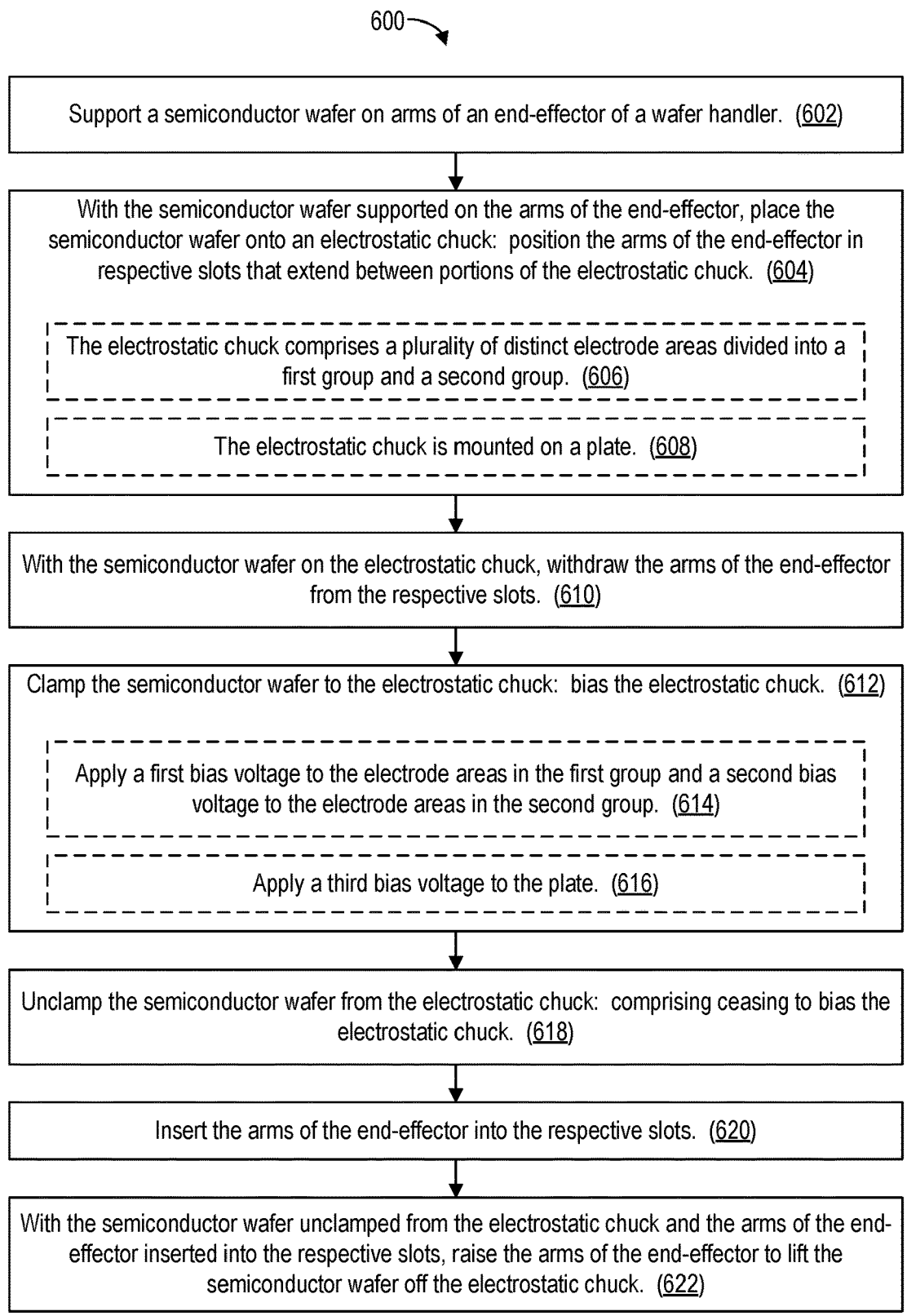
FIG. 6 is a flowchart illustrating a method of handling semiconductor wafers in accordance with some embodiments.

FIG. 6 is a flowchart illustrating a method 600 of handling semiconductor wafers in accordance with some embodiments. In the method 600, a semiconductor wafer is supported (602) on arms of an end-effector (e.g., arms 502 and 504, FIG. 5) of a wafer handler. With the semiconductor wafer supported on the arms of the end-effector, the semiconductor wafer is placed (604) onto an electrostatic chuck. To place the semiconductor wafer onto the electrostatic chuck, the arms of the end-effector are positioned in respective slots (e.g., slots 106-1 and 106-2, FIGS. 1-2) that extend between portions of the electrostatic chuck (e.g., portions 104-1, 104-2, and 104-3, FIGS. 1-2). In some embodiments, the electrostatic chuck includes (606) a plurality of distinct electrode areas (e.g., electrode areas 108/208, FIGS. 1-2) divided into a first group (e.g., portions 108-1 and 208-2, FIG. 2) and a second group (e.g., portions 108-4 and 208-3, FIG. 2). In some embodiments, the electrostatic chuck is mounted (608) on a plate (e.g., plate 102, FIGS. 1-4, which may be a mirror plate).

With the semiconductor wafer on the electrostatic chuck, the arms of the end-effector are withdrawn (610) from the respective slots. The semiconductor wafer is clamped (612) to the electrostatic chuck. Clamping the semiconductor wafer to the electrostatic chuck includes biasing the electrostatic chuck. In some embodiments, a first bias voltage is applied (614) to the electrode areas in the first group and a second bias voltage is applied (614) to the electrode areas in the second group. In some embodiments, clamping the semiconductor wafer to the electrostatic chuck further includes applying (616) a third bias voltage to the plate. For example, the plate (e.g., the outer surface of the plate 102) is first biased to the third bias voltage (e.g., 10 kV), for example through the wiring 314 and contact 316 (FIG. 3). The electrode areas in the first and second groups are then tuned to their respective first and second bias voltages (e.g., 11.5 kV and 8.5 kV respectively). For example, the electrode areas in the first group are biased through the wiring 302 and contacts 304, and the electrode areas in the second group are biased via the wiring 306 and contacts 308 (FIG. 3), or vice versa.

With the semiconductor wafer clamped to the electrostatic chuck, processing and/or characterization of the semiconductor wafer is performed. Once the processing and/or characterization is complete, the semiconductor wafer is unloaded. To unload the semiconductor wafer, the semiconductor wafer is unclamped (618) from the electrostatic chuck. Unclamping the semiconductor wafer includes ceasing to bias (618) the electrostatic chuck. In some embodiments, unclamping the semiconductor wafer further includes ceasing to bias the plate. The arms of the end-effector are inserted (620) into the respective slots. With the semiconductor wafer unclamped from the electrostatic chuck and the arms of the end-effector inserted into the respective slots, the arms of the end-effector are raised (622) to lift the semiconductor wafer off the electrostatic chuck.

Steps in the method 600 that are not order-dependent may be reordered and steps may be combined or broken out.

The method 600 and assemblies 100/200 provide multiple benefits. The space above the chuck for loading and unloading wafers may be less than the space needed when lift pins are used. The travel-time associated with lift pins is eliminated, thus reducing wafer-handling time and increasing throughput. The z-stage or other lift-pin mechanism used to raise and lower lift pins is avoided, thus reducing weight and complexity.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. An assembly for clamping semiconductor wafers, comprising:
   a plate;
   an electrostatic chuck mounted on the plate; and
   first and second slots extending between respective portions of the electrostatic chuck, to receive arms of an end-effector of a wafer-handler, wherein the arms of the end-effector are to support semiconductor wafers being placed onto and removed from the electrostatic chuck, wherein:
   the respective portions of the electrostatic chuck comprise distinct first, second, and third chuck surfaces;
   the first and second slots divide the electrostatic chuck into the distinct first, second, and third chuck surfaces;
   the first slot is situated between the first and second chuck surfaces;
   the second slot is situated between the second and third chuck surfaces;
   the first chuck surface comprises a first electrode area;
   the second chuck surface comprises a second electrode area and a third electrode area, wherein the second and third electrode areas are electrically isolated from each other; and
   the third chuck surface comprises a fourth electrode area.

2. The assembly of claim 1, wherein the distinct first, second, and third chuck surfaces are coplanar to within 10 microns.

3. The assembly of claim 1, wherein:
   each of the distinct first, second, and third chuck surfaces comprises one or more electrode areas and insulation;
   each of the one or more electrode areas comprises a respective electrically conductive layer situated beneath a dielectric layer; and
   the insulation surrounds each of the one or more electrode areas.

4. The assembly of claim 1, further comprising an opening on a side of the plate, the opening extending from the side of the plate to the first slot, the second slot, and an edge of the second chuck surface between the first and second slots;
   wherein the first slot, the second slot, and the opening compose a substantially U-shaped slot to receive the arms of the end-effector.

5. The assembly of claim 4, further comprising a groove in the plate that surrounds the electrostatic chuck, wherein the groove intersects the opening, each end of the first slot, and each end of the second slot.

6. The assembly of claim 5, wherein the groove, the opening, the first slot, and the second slot have the same depth.

7. The assembly of claim 1, wherein:
the first and second electrode areas are electrically connected; and
the third and fourth electrode areas are electrically connected.

8. The assembly of claim 7, further comprising:
an electrical connector attached to the plate;
first wiring, connected to the electrical connector, to apply a first bias voltage to the first and second electrode areas; and
second wiring, connected to the electrical connector, to apply a second bias voltage to the third and fourth electrode areas.

9. The assembly of claim 8, further comprising third wiring, connected to the electrical connector and the plate, to apply a third bias voltage to the plate.

10. The assembly of claim 1, wherein the distinct first, second, and third chuck surfaces are glued to the plate.

11. The assembly of claim 1, wherein the plate is a mirror plate comprising a plurality of mirror surfaces on respective sides of the plate, the plurality of mirror surfaces being laser-interferometer mirrors for positioning the plate.

12. The assembly of claim 1, further comprising a groove in the plate that surrounds the electrostatic chuck, wherein the groove intersects the plurality of slots.

13. The assembly of claim 12, wherein the groove and the plurality of slots have the same depth.

14. A method of handling semiconductor wafers, comprising:
supporting a semiconductor wafer on arms of an end-effector of a wafer handler;
with the semiconductor wafer supported on the arms of the end-effector, placing the semiconductor wafer onto an electrostatic chuck, comprising positioning the arms of the end-effector in first and second slots that extend between portions of the electrostatic chuck, wherein:
the electrostatic chuck is mounted on a plate,
the portions of the electrostatic chuck comprise distinct first, second, and third chuck surfaces,
the first and second slots divide the electrostatic chuck into the distinct first, second, and third chuck surfaces,
the first slot is situated between the first and second chuck surfaces,
the second slot is situated between the second and third chuck surfaces,
the first chuck surface comprises a first electrode area,
the second chuck surface comprises a second electrode area and a third electrode area, wherein the second and third electrode areas are electrically isolated from each other, and
the third chuck surface comprises a fourth electrode area;
with the semiconductor wafer on the electrostatic chuck, withdrawing the arms of the end-effector from the first and second slots; and
clamping the semiconductor wafer to the electrostatic chuck, comprising biasing the electrostatic chuck.

15. The method of claim 14, further comprising, after withdrawing the arms of the end-effector from the first and second slots and clamping the semiconductor wafer to the electrostatic chuck:
unclamping the semiconductor wafer from the electrostatic chuck, comprising ceasing to bias the electrostatic chuck;
inserting the arms of the end-effector into the first and second slots; and
with the semiconductor wafer unclamped from the electrostatic chuck and the arms of the end-effector inserted into the first and second slots, raising the arms of the end-effector to lift the semiconductor wafer off the electrostatic chuck.

16. The method of claim 14, wherein:
the electrostatic chuck comprises a plurality of distinct electrode areas divided into a first group and a second group; and
biasing the electrostatic chuck comprises applying a first bias voltage to the electrode areas in the first group and applying a second bias voltage to the electrode areas in the second group.

17. The method of claim 16, wherein:
the electrostatic chuck is mounted on a plate; and
clamping the semiconductor wafer to the electrostatic chuck further comprises applying a third bias voltage to the plate.

18. An assembly for clamping semiconductor wafers, comprising:
a plate;
an electrostatic chuck, mounted on the plate, comprising a plurality of distinct electrode areas, wherein each electrode area of the plurality of distinct electrode areas comprises a respective electrically conductive layer;
a plurality of slots extending between respective portions of the electrostatic chuck, to receive arms of an end-effector of a wafer-handler, wherein the arms of the end-effector are to support semiconductor wafers being placed onto and removed from the electrostatic chuck; and
a conductive via extending through the plate to connect to the respective electrically conductive layer of a respective electrode area of the plurality of distinct electrode areas.

19. The assembly of claim 18, wherein the respective electrode area of the plurality of distinct electrode areas further comprises:
a respective dielectric layer situated above the respective electrically conductive layer; and
a respective insulating layer situated below the respective electrically conductive layer;
wherein the conductive via extends through the respective insulating layer to connect to the respective electrically conductive layer.

20. The assembly of claim 18, further comprising glue to connect the electrostatic chuck to the plate;
wherein the conductive via extends through the glue.

21. The assembly of claim 18, further comprising:
an electrical connector attached to the plate; and
wiring, connected to the electrical connector, to apply bias voltages to the plurality of distinct electrode areas, wherein the wiring comprises wiring to apply a respective bias voltage to the respective electrode area through the conductive via.

22. A method of handling semiconductor wafers, comprising:
supporting a semiconductor wafer on arms of an end-effector of a wafer handler;
with the semiconductor wafer supported on the arms of the end-effector, placing the semiconductor wafer onto an electrostatic chuck, comprising positioning the arms of the end-effector in respective slots that extend between portions of the electrostatic chuck, wherein the electrostatic chuck is mounted on a plate and comprises a plurality of distinct electrode areas divided into a first group and a second group;

with the semiconductor wafer on the electrostatic chuck, withdrawing the arms of the end-effector from the respective slots; and biasing the electrostatic chuck to clamp the semiconductor wafer to the electrostatic chuck, comprising applying a first bias voltage to the electrode areas in the first group, applying a second bias voltage to the electrode areas in the second group, and applying a third bias voltage to the plate.

* * * * *